(12) United States Patent
Fujihara

(10) Patent No.: US 11,215,640 B2
(45) Date of Patent: Jan. 4, 2022

(54) PROBER AND PROBE CARD CLEANING METHOD

(71) Applicant: Tokyo Electron Limited, Tokyo (JP)

(72) Inventor: Jun Fujihara, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/001,998

(22) Filed: Aug. 25, 2020

(65) Prior Publication Data

US 2021/0063443 A1 Mar. 4, 2021

(30) Foreign Application Priority Data

Aug. 28, 2019 (JP) .............................. JP2019-156110

(51) Int. Cl.
*G01R 31/28* (2006.01)
*G01R 1/073* (2006.01)

(52) U.S. Cl.
CPC ..... *G01R 1/07307* (2013.01); *G01R 31/2887* (2013.01); *G01R 31/2891* (2013.01)

(58) Field of Classification Search
CPC .................. G01R 1/07307; G01R 1/07342
See application file for complete search history.

(56) References Cited

U.S. PATENT DOCUMENTS

| 2010/0156434 | A1* | 6/2010 | Okino | H01L 21/67253 324/537 |
| 2014/0118018 | A1* | 5/2014 | Washio | G01R 31/2887 324/756.03 |
| 2017/0059442 | A1* | 3/2017 | McClanahan | G01M 3/3272 |

FOREIGN PATENT DOCUMENTS

JP 2017-112259 A 6/2017

* cited by examiner

*Primary Examiner* — Tung X Nguyen
(74) *Attorney, Agent, or Firm* — Nath, Goldberg & Meyer; Jerald L. Meyer; Tanya E. Harkins

(57) ABSTRACT

There is provided a prober provided with a plurality of inspection chambers. Each inspection chambers includes: a probe card having a plurality of probes; a probe card holder configured to hold the probe card; a chuck top configured to place a cleaning wafer thereon; an aligner configured to drive the chuck top in a vertical direction when the probe card is cleaned using the cleaning wafer; a seal mechanism configured to allow a sealed space to be provided between the probe card holder and the chuck top; a pressure sensor configured to detect an internal pressure of the sealed space, which fluctuates with an operation of the chuck top driven by the aligner; and an electro-pneumatic regulator configured to control the internal pressure of the sealed space by performing an intake or exhaust operation with respect to the sealed space based on the internal pressure detected by the pressure sensor.

5 Claims, 6 Drawing Sheets

PROBER AND PROBE CARD CLEANING METHOD

CROSS-REFERENCE TO RELATED APPLICATION

This application is based upon and claims the benefit of priority from Japanese Patent Application No. 2019-156110, filed on Aug. 28, 2019, the entire contents of which are incorporated herein by reference.

TECHNICAL FIELD

The present disclosure relates to a prober and a probe card cleaning method.

BACKGROUND

A prober can be thought of as an inspection apparatus for inspecting a wafer on which a large number of semiconductor devices are formed. The prober includes a probe card having probes that are a plurality of column-shaped contact terminals. In the prober, each probe is brought into contact with an electrode pad or solder bump in each semiconductor device by bringing the wafer into contact with the probe card. Further, the prober supplies electric current to the electric circuit of a semiconductor device, which is connected to each electrode pad or each solder bump, thereby inspecting the conduction state of the electric circuit.

PRIOR ART DOCUMENT

Patent Document

Patent Document 1: Japanese Laid-Open Patent Publication No. 2017-112259

SUMMARY

According to one embodiment of the present disclosure, there is provided a prober provided with a plurality of inspection chambers, wherein each of the plurality of inspection chambers comprises: a probe card provided with a plurality of probes; a probe card holder configured to hold the probe card; a chuck top configured to place a cleaning wafer thereon; an aligner configured to drive the chuck top in a vertical direction when the probe card is cleaned using the cleaning wafer; a seal mechanism configured to allow a sealed space to be provided between the probe card holder and the chuck top; a pressure sensor configured to detect an internal pressure of the sealed space, which fluctuates with an operation of the chuck top driven by the aligner; and an electro-pneumatic regulator configured to control the internal pressure of the sealed space by performing an intake or exhaust operation with respect to the sealed space based on the internal pressure detected by the pressure sensor.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, embodiments of a prober and a probe card cleaning method disclosed herein will be described in detail with reference to the drawings. The technology disclosed herein is not limited by the following embodiments. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In recent years, in order to improve wafer inspection efficiency, there has been developed a prober that has a plurality of inspection chambers and is capable of inspecting semiconductor devices of a wafer in one inspection chamber while a wafer is being transferred to another inspection chamber by a transfer device. In this prober, when the wafer is brought into contact with the probe card, the wafer is placed on a chuck top and a space between the probe card and the chuck top is evacuated so as to bring the wafer into contact with the probe card. Here, when the wafer is brought into contact with the probe card, the chuck top is placed on a stage, and the stage moves the chuck top toward the probe card. Then, the chuck top is attracted to the probe card and is separated from the stage.

However, as the wafer inspection is repeated, the contact between the electrode pads and the like on the wafer and the probes are repeatedly performed. As a result, tips of the probes may be worn away, and metallic scraps, which are generated due to scraping of the electrode pads or the like, may be attached to the tips of the probes. In view of this, there has been proposed a technique for polishing probes by placing a polishing wafer on a chuck top in a state of being placed on a bulged member and operating an aligner in a Z-axis direction (vertical direction). When the bulged member is used, a space between the probe card and the chuck top is not closed, and thus the operation of the aligner in the Z-axis direction is not hindered. However, the bulged member is required to have a thin structure and be extremely flat. This increases costs. Meanwhile, when the bulged member is not used, the space between the probe card and the chuck top is closed so that the operation of the aligner in the Z-axis direction may be hindered due to a fluctuation in pressure of the space. Therefore, the probes are required to be cleaned without hindering the operation of the aligner in the Z-axis direction even if the space is in the closed state. That is, the probes are required to be cleaned without having to use the bulged member.

Configuration of Prober

Figure 1:
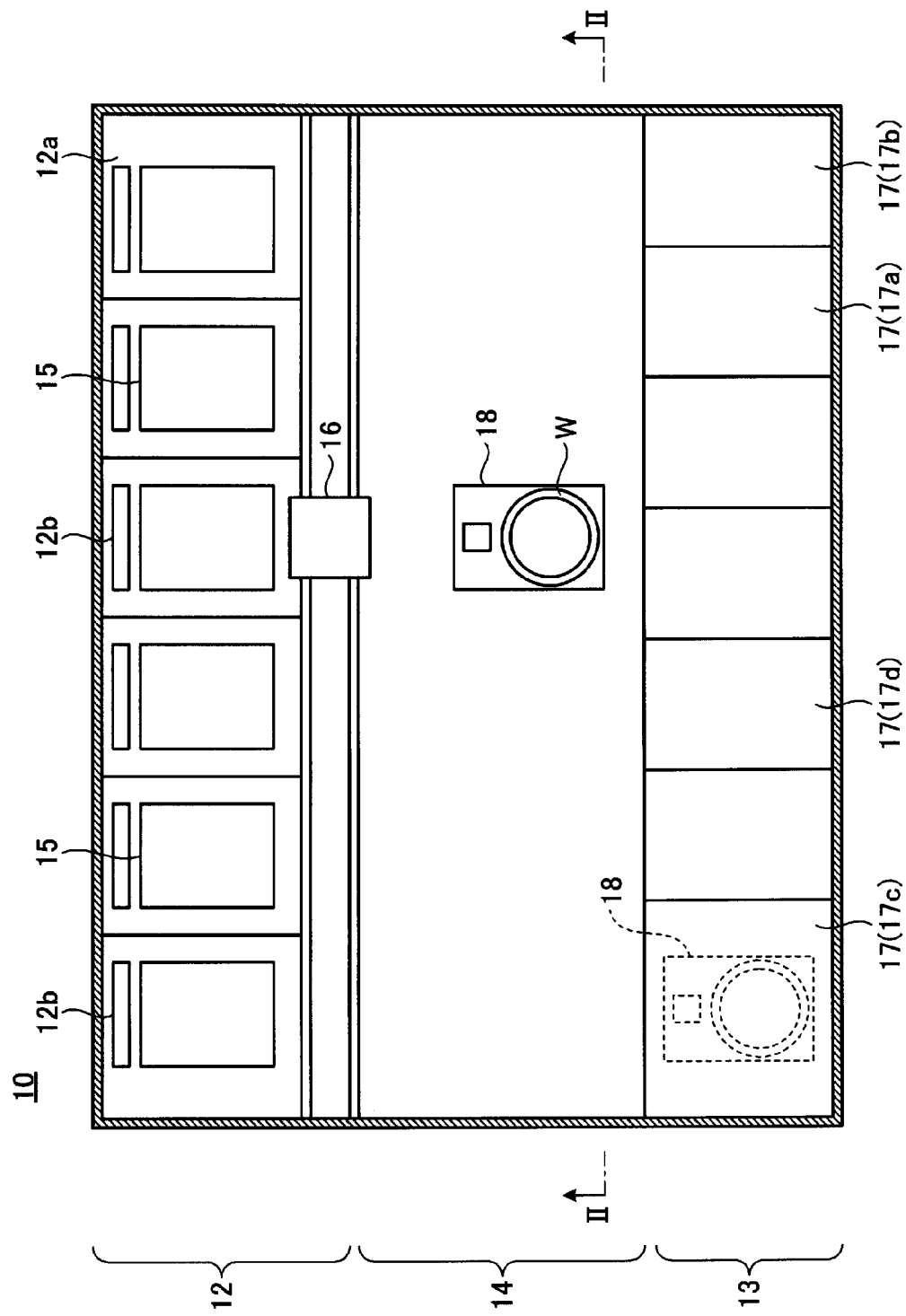
FIG. 1 is a view illustrating an example of a prober according to a first embodiment of the present disclosure.

FIG. 1 is a view illustrating an example of a prober according to a first embodiment of the present disclosure.

Figure 2:
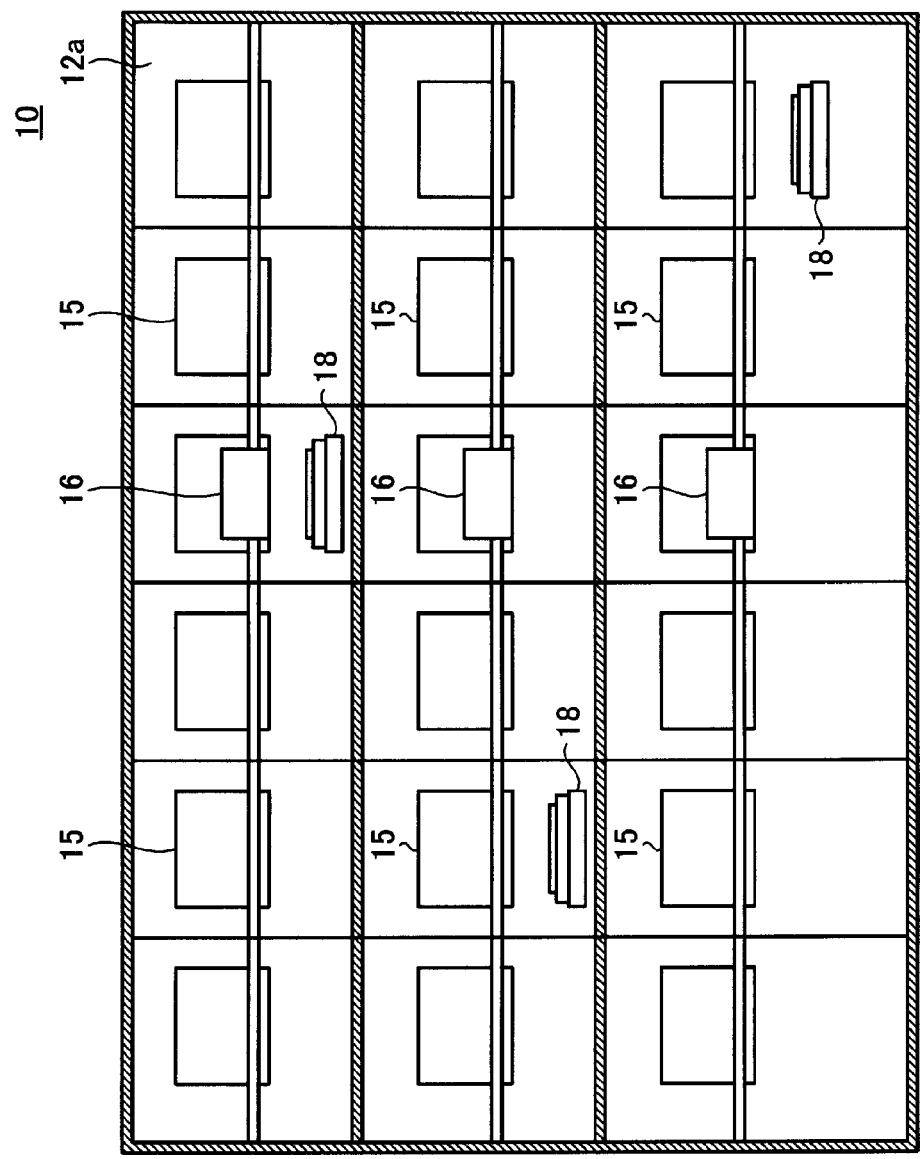
FIG. 2 is a cross-sectional view taken along line II-II in FIG. 1.

FIG. 2 is a cross-sectional view taken along line II-II in FIG. 1. A prober 10 illustrated in FIGS. 1 and 2 is provided with an inspection area 12 in which an electrical characteristic inspection of each semiconductor device of a wafer W is performed, an accommodation area 13 in which wafers W are accommodated, and a transfer area 14 provided between the inspection area 12 and the accommodation area 13.

A plurality of testers 15, each serving as a wafer inspection interface, are arranged in the inspection area 12, and a plurality of inspection chambers 12a corresponding to the testers 15 are provided. Specifically, the inspection area 12 has a three-layer structure. Each layer has a tester row including a plurality of testers that are horizontally arranged. One tester-side camera 16 is arranged corresponding to each tester row. Each tester-side camera 16 moves horizontally along the respective tester row and is positioned in front of each tester 15 so as to identify the position of the wafer W or the like, and the degree of inclination of a chuck top 29. Each inspection chamber 12a is provided with an electro-pneumatic regulator 12b configured to perform intake or exhaust with respect to a sealed space S (to be described later) so as to control an internal pressure of the sealed space S.

The accommodation area 13 is divided into a plurality of accommodation spaces 17. A port 17a, an aligner 17b, a loader 17c, and a controller 17d are arranged in each accommodation space 17. The port 17a receives a FOUP, which is a container that accommodates a plurality of wafers. The aligner 17b aligns the wafers. A probe card 19 is loaded into and unloaded from the loader 17c. The controller 17d controls the operation of each component.

In the transfer area 14, a transfer device 18 configured to be movable to the inspection area 12 and the accommodation area 13 is arranged. The transfer device 18 receives the wafer W from the port 17a and transfers the wafer W to each inspection chamber 12a, and also transfers the wafer W which has been subjected to the electrical characteristic inspection of semiconductor devices, from each inspection chamber 12a to the port 17a.

While the transfer device 18 transfers one wafer W between one inspection chamber 12a and the port 17a, another inspection chamber 12a is able to perform an electrical characteristic inspection of each semiconductor device on another wafer W. Therefore, it is possible to improve wafer inspection efficiency.

Figure 3:
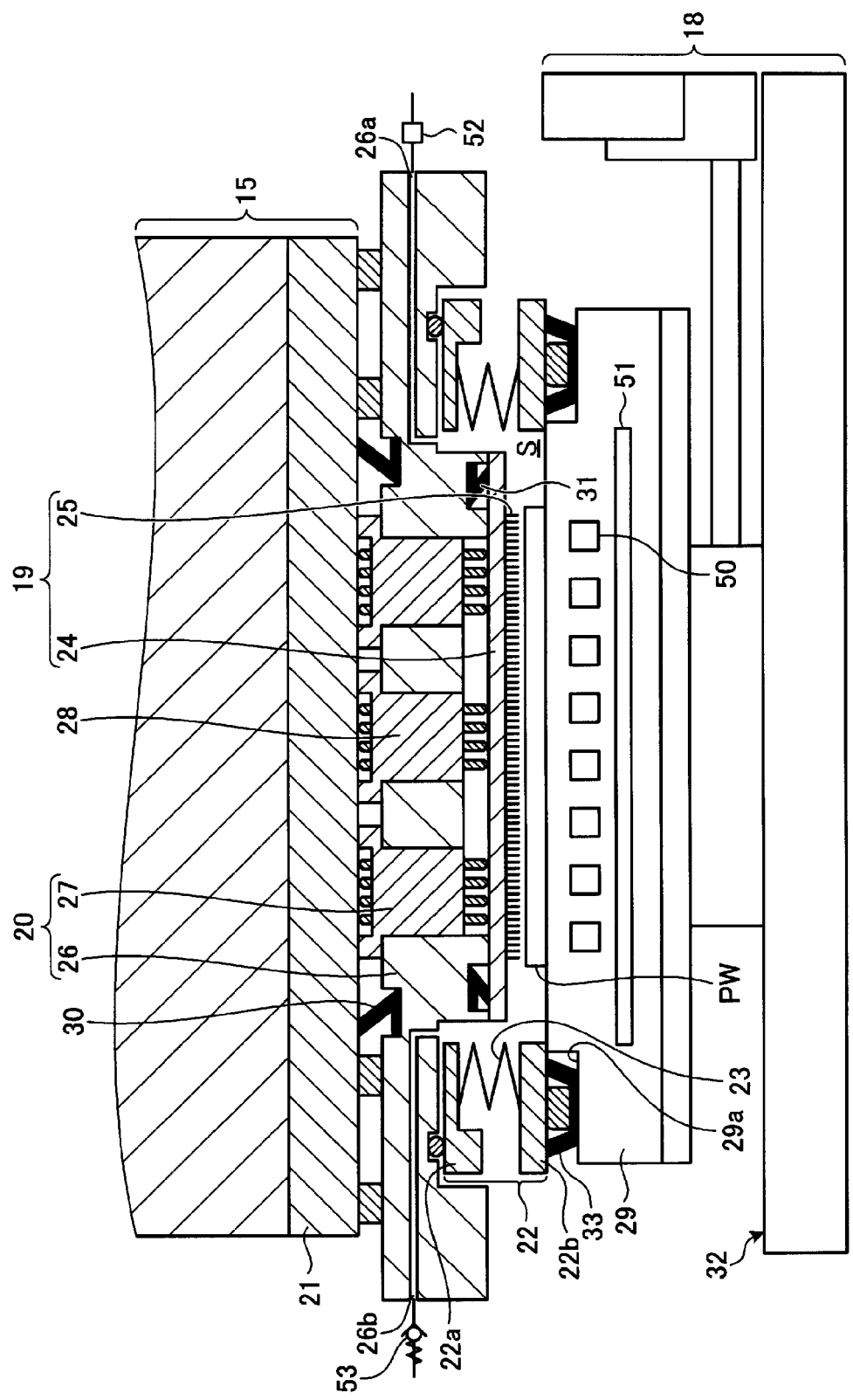
FIG. 3 is a view illustrating an exemplary configuration of the prober according to the first embodiment.

FIG. 3 is a view illustrating an exemplary configuration of the prober according to the first embodiment. FIG. 3 illustrates a state in which cleaning is performed on probes 25 of a probe card 19. That is, FIG. 3 illustrates a state in which a seal mechanism 33 of the chuck top 29 is brought into contact with a lower flange 22b of a flange 22, and mainly illustrates the configuration of the inspection chamber 12a in a cross-sectional view.

In FIG. 3, the tester 15 is installed on a pogo frame 20 fixed to an apparatus frame (not illustrated). The probe card 19 is mounted below the pogo frame 20. The flange 22 is disposed so as to surround the probe card 19.

The probe card 19 includes a disk-shaped body 24, a large number of electrodes (not illustrated) arranged on substantially one surface of the top surface of the body 24, and the large number of probes 25 arranged so as to protrude downwards from the bottom surface of the body 24. Each electrode is connected to the respective probe 25. When the wafer W comes into contact with the probe card 19, each probe 25 is brought into close contact with an electrode pad or a solder bump of each semiconductor device formed on the wafer W.

The pogo frame 20 includes a substantially flat plate-shaped body 26 and a plurality of pogo block insertion holes 27, which are through-holes formed to be bored in the vicinity of the central portion of the body 26. A pogo block 28 formed by a plurality of pogo pins arranged therein is inserted into each pogo block insertion hole 27. Each pogo block 28 is connected to an inspection circuit (not illustrated) included in the tester 15, and comes into contact with the large number of electrodes on the top surface of the body 24 of the probe card 19 mounted on the pogo frame 20. The pogo block 28 supplies electric current to each probe 25 of the probe card 19 connected to the respective electrode, and also supplies, to the inspection circuit, electric current flowing thereto from the electric circuit of each semiconductor device of the wafer W through each probe 25.

The flange 22 is provided with an upper flange 22a and the lower flange 22b. In addition, the flange 22 includes a cylindrical bellows 23 between the upper flange 22a and the lower flange 22b. The upper flange 22a is engaged with the pogo frame 20, and is sealed using, for example, a packing. The lower flange 22b is movable in the vertical direction with respect to the pogo frame 20.

Until the chuck top 29 comes into contact with the lower flange 22b, the lower flange 22b moves downwards by its own weight such that the bottom surface of the lower flange 22b is located below the tip end of each contact probe 25 of the probe card 19. The bellows 23 is a metallic bellows structure, and is configured to be extendable in the vertical direction. Lower and upper ends of the bellows 23 are in close contact with the top surface of the lower flange 22b and the bottom surface of the upper flange 22a, respectively.

A space between the pogo frame 20 and a base 21 of the tester 15 is sealed by a seal member 30 and is evacuated. Thus, the base 21 is attached to the pogo frame 20. A space between the pogo frame 20 and the probe card 19 is also sealed by a seal member 31 and is evacuated. Thus, the probe card 19 is attached to the pogo frame 20.

The transfer device 18 includes an aligner 32. The chuck top 29 is placed on the aligner 32, and the wafer W is placed on the upper surface of the chuck top 29. In FIG. 3, instead of the wafer W, a cleaning wafer PW is placed on the chuck top 29. In the following description, there may be a case where the wafer W includes the cleaning wafer PW. The chuck top 29 is vacuum-suctioned to the aligner 32, and the wafer W is vacuum-suctioned to the chuck top 29. Accordingly, when the transfer device 18 moves, the wafer W can be prevented from moving relative to the transfer device 18. The method of holding the chuck top 29 and the wafer W is not limited to the vacuum-suction, and any method may be used, as long as the movement of the chuck top 29 and the wafer W relative to the aligner 32 can be prevented. For example, holding based on an electromagnetic suction or clamp may be used. A stepped portion 29a is formed in the peripheral edge of the top surface of the chuck top 29, and a seal mechanism 33 is disposed in the stepped portion 29a.

In addition, the chuck top 29 includes a flow path 50 and a heater 51 provided therein. A coolant is supplied to the flow path 50 from a chiller unit (not illustrated). The coolant supplied to the flow path 50 flows through the flow path 50, and then returns to the chiller unit. A heater power supply (not illustrated) is connected to the heater 51. When power is supplied to the heater 51, the chuck top 29 is heated. The temperature of the chuck top 29 is adjusted by cooling by the coolant circulating throughout the flow path 50 and heating by the heater 51.

The transfer device 18 may be moved below the probe card 19 in the inspection chamber 12a so as to make the wafer W placed on the chuck top 29 face the probe card 19 and to move the wafer W towards the probe card 19. The movement of the transfer device 18 is controlled by the controller 17d. The controller 17d detects the position and the amount of movement of the transfer device 18.

The sealed space S is a space formed between the pogo frame 20 and the chuck top 29 when the chuck top 29 comes into contact with the lower flange 22b. The sealed space S is sealed by the bellows 23 and the seal mechanism 33. In the sealed space S, when a wafer W other than the cleaning wafer PW is inspected, the sealed space S is evacuated via a vacuum line 26a, and thus the chuck top 29 is held on the side of the probe card 19. The method of holding the chuck top 29 is not limited to the vacuum suction, and may be any method as long as it is capable of forming the sealed space S. For example, holding based on an electromagnetic attraction or clamp may be used.

Meanwhile, during cleaning using the cleaning wafer PW, the sealed space S is not evacuated, and thus the chuck top 29 is not vacuum-suctioned. In this case, since the aligner 32 is moved up and down in the Z-axis direction (vertical direction) in order to repeatedly bring the cleaning wafer PW into contact with the probes 25, the internal pressure of the sealed space S changes. Therefore, the internal pressure of the sealed space S is controlled by the electro-pneumatic regulator 12b that is connected to the sealed space S via the vacuum line 26a and a pressure sensor 52. As the cleaning wafer PW, various cleaning wafers, such as a wafer that attracts metallic scraps using an adhesive sheet, a wafer that polishes the tip ends of the probes 25 using a polishing sheet and the like, may be used.

The pressure sensor 52 detects the internal pressure of the sealed space S and feeds the same back to the electro-pneumatic regulator 12b. The electro-pneumatic regulator 12b performs intake or exhaust operation with respect to the sealed space S based on the internal pressure detected by the pressure sensor 52. In addition, a pressure value that serves as a control reference is obtained for each probe card in advance by experiment or the like. For example, when the internal pressure of the sealed space S is increased with the upward movement of the aligner 32 in the Z-axis direction, the electro-pneumatic regulator 12b performs the exhaust operation with respect to the sealed space S. In addition, for example, when the internal pressure of the sealed space S is decreased with the downward movement of the aligner 32 in the Z-axis direction, the electro-pneumatic regulator 12b performs the intake operation with respect to the sealed space S.

A check valve 53 is connected to the sealed space S via an exhaust line 26b. When the internal pressure of the sealed space S exceeds a preset pressure, the check valve 53 is opened so as to perform exhaust of gas from the sealed space S. That is, the check valve 53 assists the exhaust of the interior of the sealed space S by the electro-pneumatic regulator 12b.

The aligner 32 adjusts the position and inclination of the chuck top 29 relative to the probe card 19. Temperature adjustment parts, such as the flow path 50, the heater 51 and the like, implement an inspection under a high-temperature environment or a low-temperature environment. Therefore, the aligner 32 adjusts the position and inclination of the chuck top 29 which are associated with the deformation of the probe card 19 or the chuck top 29 due to the radiation of heat from the heater 51 or the absorption of heat to the flow path 50 in an inspection under a high-temperature environment or a low-temperature environment. The temperature range of the chuck top 29 may be, for example, a range of 130 degrees C. to −30 degrees C.

The aligner 32 includes bases and rail-shaped guides corresponding to the X-, Y-, and Z-axis directions, respectively. Each base is movable along each guide. A Z-block provided on the Z base is provided with a substantially disk-shaped chuck base. The chuck base has a chuck top suction surface on the top surface thereof, and the chuck top 29 is vacuum-suctioned to the chuck top suction surface. As a result, the chuck top 29 is placed on and attached to the aligner 32. At this time, the position of the chuck top 29 with respect to the chuck base is defined using a positioning pin, a positioning block or the like.

In addition, the aligner 32 includes an upper monitoring camera for monitoring a degree of inclination of the probe card 19 and the pogo frame 20. In addition, the aligner 32 is capable of adjusting the inclination of the chuck top 29 placed thereon by lifting the chuck base using an actuator.

Probe Card Cleaning Method

Figure 4:
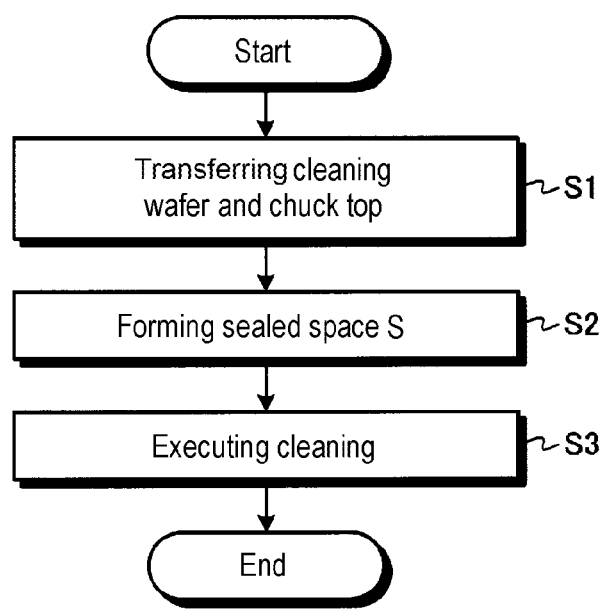
FIG. 4 is a flowchart illustrating an example of a probe card cleaning method according to the first embodiment.

Next, a probe card cleaning method according to the first embodiment will be described. FIG. 4 is a flowchart illustrating an example of the probe card cleaning method according to the first embodiment. In the following description, it is assumed that the probe card 19 is in the state of being vacuum-suctioned to the pogo frame 20.

In the inspection chamber 12a in which the cleaning of the probe card 19 is performed, the chuck top 29 is transferred from the inspection chamber 12a using the transfer device 18, and the cleaning wafer PW is placed on the chuck top 29. The chuck top 29 on which the cleaning wafer PW is placed is transferred to the inspection chamber 12a. The cleaning wafer PW and the chuck top 29 are transferred below the probe card 19 using the transfer device 18 (step S1).

The chuck top 29 is raised so as to bring the seal mechanism 33 into contact with the lower flange 22b, thereby forming the sealed space S (step S2).

The cleaning of the probe card 19 is performed by controlling the electro-pneumatic regulator 12b and the aligner 32 (step S3). When cleaning, the aligner 32 is driven in the Z-axis direction so as to move the cleaning wafer PW and the chuck top 29 up and down such that the cleaning wafer PW is repeatedly brought into contact with the probes 25 of the probe card 19. In addition, the electro-pneumatic regulator 12b performs an intake or exhaust operation with respect to the sealed space S based on the internal pressure of the sealed space S, which is detected by the pressure sensor 52, thereby controlling the internal pressure of the sealed space S. After the cleaning is completed, the cleaning wafer PW is transferred to, for example, the port 17a using the transfer device 18.

Thus, even when the sealed space S is formed, the probes 25 can be cleaned without hindering the operation of the aligner 32 in the Z-axis direction. That is, it is possible to suppress occurrence of a phenomenon in which the cleaning wafer PW excessively collides with the probes 25 or does not come into contact with the probes 25, wherein the phenomenon occurs due to a fluctuation in the pressure. That is, it is possible to clean the probes 25 without having to use the bulged member.

Modification

In the first embodiment, the cleaning of the probes 25 is performed without vacuum-suctioning the chuck top 29 to the pogo frame 20, but the present disclosure is not limited thereto. For example, the cleaning may be performed by controlling the internal pressure of the sealed space S in the state in which the chuck top 29 is vacuum-suctioned to the pogo frame 20. In this case, the chuck top 29 and the aligner 32 are in the state of being separated from each other, and the contact between the cleaning wafer PW and the probes 25 is repeated through the pressure control performed by the electro-pneumatic regulator 12b.

In the first embodiment, the pressure detected by the pressure sensor 52 is fed back so that the electro-pneumatic regulator 12b performs the pressure control, but the present disclosure is not limited thereto. For example, a feed forward control may be performed using a Z-axis coordinate and movement speed of the aligner 32.

Second Embodiment of Configuration of Prober

In the first embodiment, the internal pressure of the sealed space S is controlled. However, by controlling the height of the lower flange 22b, the bulged member may not be used and the sealed space S may not be formed. An embodiment in this case will be described as a second embodiment. The same components as those in the first embodiment will be designated by the same reference numerals, and descriptions of the configurations and operations that overlap with the first embodiment will be omitted.

Figure 5:
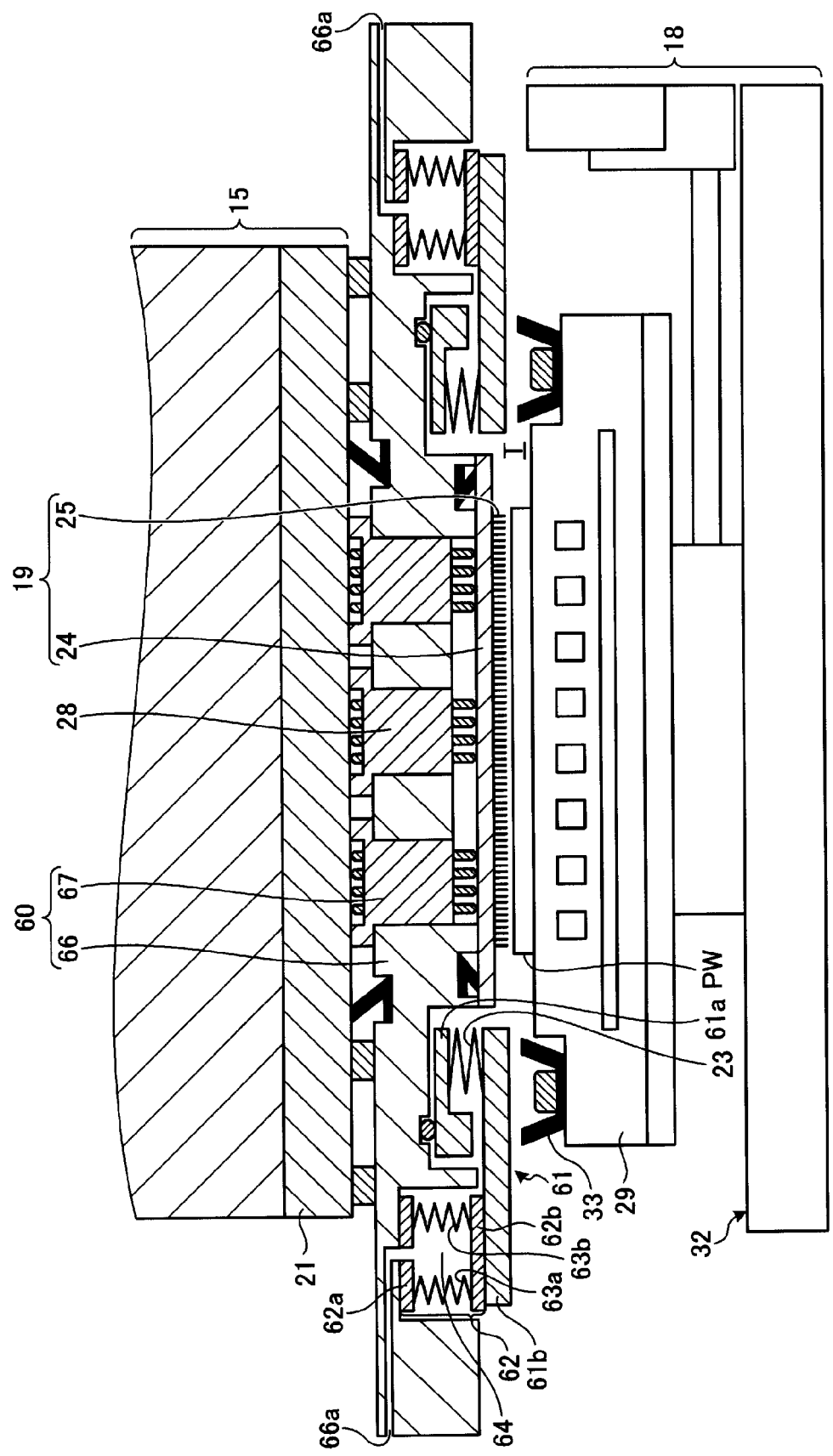
FIG. 5 is a view illustrating an exemplary configuration of a prober according to a second embodiment.

Compared to the first embodiment, the second embodiment includes a pogo frame 60 and flanges 61 and 62 instead of the pogo frame 20 and the flange 22. FIG. 5 is a view illustrating an exemplary configuration of a prober according to the second embodiment. In addition, FIG. 5 illustrates a state immediately before or after the cleaning wafer PW placed on the chuck top 29 is brought into contact with the probes 25 of the probe card 19, and mainly shows the configuration of the inspection chamber 12a in a cross-sectional view.

As illustrated in FIG. 5, the pogo frame 60 includes a substantially flat plate-shaped body 66 and a plurality of pogo block insertion holes 67, which are through-holes bored in the vicinity of the central portion of the body 66. A pogo block 28 formed by a plurality of pogo pins arranged therein is inserted into each pogo block insertion hole 67. The pogo frame 60 also includes a vacuum line 66a for evacuating a sealed space 64 within the flange 62. In FIG. 5, a vacuum line for evacuating the sealed space S is omitted.

The flange 61 has an upper flange 61a and a lower flange 61b. In addition, the flange 61 has a cylindrical bellows 23 provided between the upper flange 61a and the lower flange 61b. The upper flange 61a is engaged with the pogo frame 60, and is sealed using a packing or the like. The lower flange 61b is movable in the vertical direction with respect to the pogo frame 60. Until the chuck top 29 comes into contact with the lower flange 61b, or until the sealed space 64 in the flange 62 is evacuated, the lower flange 61b moves downwards due to its own weight such that the bottom surface thereof is located blow the tip end of each probe 25 of the probe card 19. The lower flange 61b extends in the outer circumferential direction compared with the lower flange 22b of the first embodiment. A bottom surface of a lower flange 62b of the flange 62 is engaged with a top surface of the extended portion of the lower flange 61b.

The flange 62 has an upper flange 62a and the lower flange 62b. In addition, the flange 62 has cylindrical bellows 63a and 63b between the upper flange 62a and the lower flange 62b. The flange 62 is provided on the outer circumferential side of the probe card 19 and the flange 61, and has, for example, a ring shape. The flange 62 may include a plurality of small flanges provided on the circumference. The upper flange 62a is engaged with the pogo frame 60, and has a through-hole provided in a portion connected with the vacuum line 66a. The bellows 63a and 63b have metallic bellows structures, and are configured to be expandable in the vertical direction. Lower and upper ends of the bellows 63a and 63b are in close contact with the top surface of the lower flange 62b and the bottom surface of the upper flange 62a, respectively.

The sealed space 64 is formed by the upper flange 62a, the lower flange 62b, and the bellows 63a and 63b. When the sealed space 64 is evacuated by the vacuum line 66a, the lower flange 61b engaged with the lower flange 62b is moved upwards. When the cleaning wafer PW comes into contact with the probes 25 during the cleaning, the lower flange 61b is moved to a position where the bottom surface of the lower flange 61b does not come into contact with the seal mechanism 33. A space T is an open space formed between the pogo frame 60 and the chuck top 29 in this state. The space T corresponds to the sealed space S in the first embodiment.

As described above, in the second embodiment, by moving the lower flange 61b upwards, the space T is not sealed. Thus, it is possible to clean the probes 25 without hindering the operation of the aligner 32 in the Z-axis direction. That is, it is possible to clean the probes 25 without having to use a bulged member.

Modification of Second Embodiment

In the second embodiment described above, the space T is not sealed by using the two flanges 61 and 62. However, the space T may not be sealed by providing and evacuating the sealed space within the flange 22 of the first embodiment. In the present modification, the same components as those in the first embodiment are designated by the same reference numerals, and descriptions of the configurations and operations that overlap with the first embodiment will be omitted.

Figure 6:
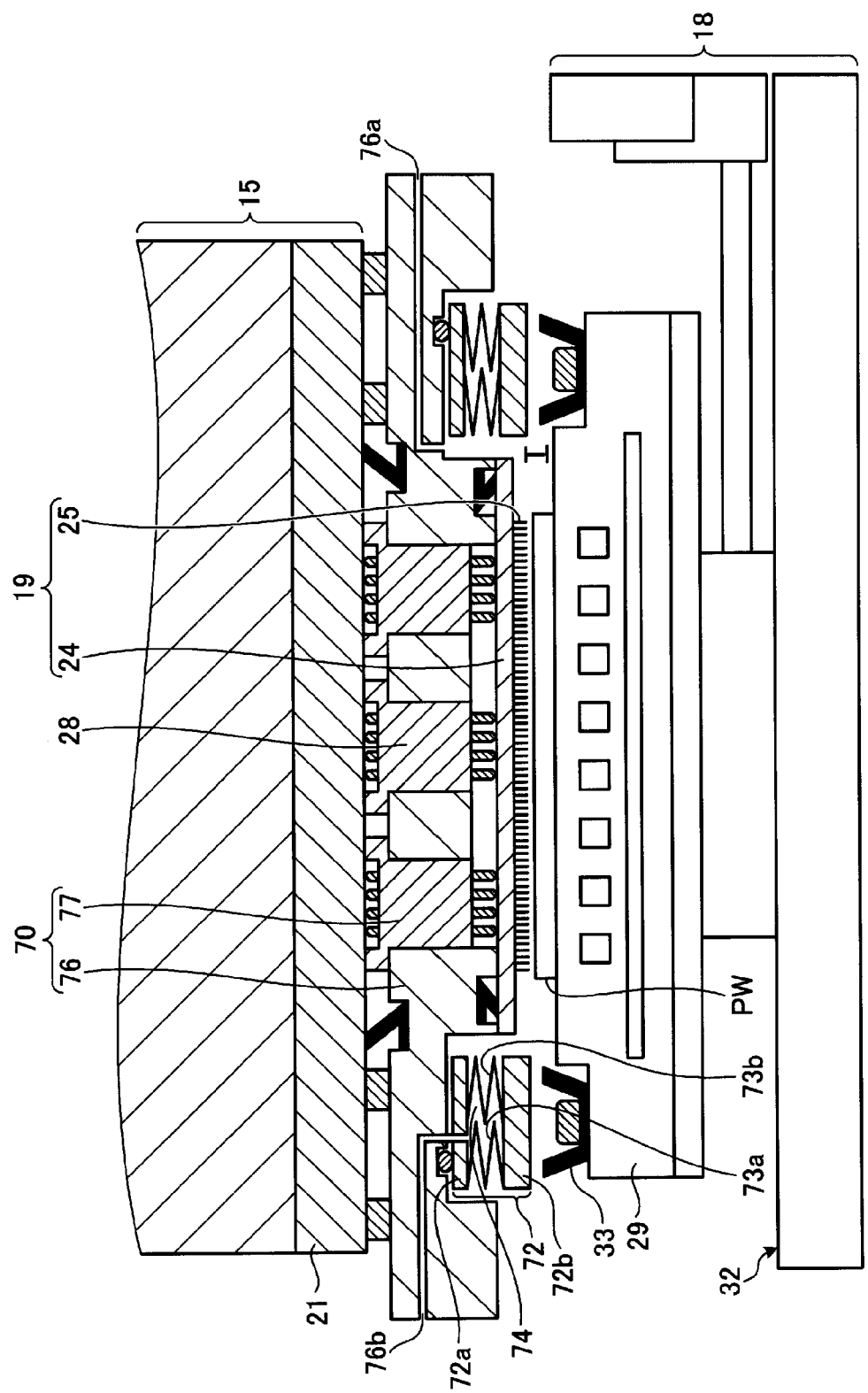
FIG. 6 is a view illustrating an exemplary configuration of a prober in a modification of the second embodiment.

Compared to the first embodiment, the modification of the second embodiment includes a pogo frame 70 and a flange 72 instead of the pogo frame 20 and the flange 22. FIG. 6 is a view illustrating an exemplary configuration of a prober in a modification of the second embodiment. In addition, FIG. 6 illustrates a state immediately before or after the cleaning wafer PW placed on the chuck top 29 is brought into contact with the probes 25 of the probe card 19, and mainly shows the configuration of the inspection chamber 12a in a cross-sectional view.

As illustrated in FIG. 6, the pogo frame 70 includes a substantially flat plate-shaped body 76 and a plurality of pogo block insertion holes 77, which are through-holes bored in the vicinity of the central portion of the body 76. A pogo block 28 formed by a plurality of pogo pins arranged therein is inserted into each pogo block insertion hole 77. In addition, the pogo frame 70 has a vacuum line 76a for evacuating a sealed space (corresponding to the sealed space S in the first embodiment) formed between the pogo frame 70 and the chuck top 29 when inspecting a wafer W other than the cleaning wafer PW. The pogo frame 70 also includes a vacuum line 76b for evacuating a sealed space 74 within the flange 72.

The flange 72 has an upper flange 72a and a lower flange 72b. In addition, the flange 72 has cylindrical bellows 73a and 73b between the upper flange 72a and the lower flange 72b. The flange 72 is provided on the outer circumferential side of the probe card 19, and has, for example, a ring shape. The upper flange 72a is engaged with the pogo frame 70, and is sealed using a packing or the like. In addition, the upper flange 72a has a through-hole provided in a portion connected with the vacuum line 76b. The lower flange 72b is movable in the vertical direction with respect to the pogo frame 70.

Until the chuck top 29 comes into contact with the lower flange 72b, or until the sealed space 74 within the flange 72 is evacuated, the lower flange 72b moves downwards by its own weight such that the bottom surface of the lower flange 72b is located below the tip end of each probe 25 of the probe card 19. The bellows 73a and 73b have metallic bellows structures, and are configured to be expandable in the vertical direction. Lower and upper ends of the bellows 73a and 73b are in close contact with the top surface of the lower flange 72b and the bottom surface of the upper flange 72a, respectively.

The sealed space 74 is formed by the upper flange 72a, the lower flange 72b, and the bellows 73a and 73b. When the sealed space 74 is evacuated by the vacuum line 76b, the lower flange 72b is moved upwards. When the cleaning wafer PW comes into contact with the probes 25 during the cleaning, the lower flange 72b is moved to a position where the bottom surface of the lower flange 72b does not come into contact with the seal mechanism 33. A space T is an open space formed between the pogo frame 70 and the chuck top 29 in this state. The space T corresponds to the sealed space S in the first embodiment.

As described above, in the modification of the second embodiment, by moving the lower flange 72b upwards, the space T is not sealed. Thus, it is possible to clean the probes 25 without hindering the operation of the aligner 32 in the Z-axis direction. That is, it is possible to clean the probes 25 without having to use a bulged member.

As described above, according to the first embodiment, the prober 10 is a prober including the plurality of inspection chambers 12a. Each of the inspection chambers 12a includes the probe card 19, the pogo frame 20 which is a probe card holder, the chuck top 29, the aligner 32, the seal mechanism 33, the pressure sensor 52, and the electro-pneumatic regulator 12b. The probe card 19 has the plurality of probes 25. The pogo frame 20 holds the probe card 19. The cleaning wafer PW is placed on the chuck top 29. The aligner 32 drives the chuck top 29 in the vertical direction when cleaning the probe card 19 using the cleaning wafer PW. The seal mechanism 33 forms the sealed space S between the pogo frame 20 and the chuck top 29. The pressure sensor 52 detects the internal pressure of the sealed space S, wherein the internal pressure changes according to the operation of the chuck top 29 driven by the aligner 32. The electro-pneumatic regulator 12b performs the intake or exhaust operation with respect to the sealed space S based on the pressure detected by the pressure sensor 52, so as to control the internal pressure of the sealed space S. As a result, it is possible to clean the probes without having to use a bulged member.

According to the first embodiment, there is provided the check valve 53 configured to perform the exhaust of gas from the sealed space S when the internal pressure of the sealed space S exceeds a preset pressure. As a result, it is possible to improve followability to the control of the internal pressure of the sealed space S by the electro-pneumatic regulator 12b.

In addition, according to the first embodiment, the electro-pneumatic regulator 12b controls the internal pressure of the sealed space S based on drive information of the aligner 32.

As a result, it is possible to control the internal pressure of the sealed space S based on the operation of the aligner 32.

According to the present disclosure in some embodiments, it is possible to clean probes without having to use a bulged member.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A prober comprising a plurality of inspection chambers, wherein each of the plurality of inspection chambers comprises:
   a probe card provided with a plurality of probes;
   a probe card holder configured to hold the probe card;
   a chuck top configured to place a cleaning wafer thereon;
   an aligner configured to drive the chuck top in a vertical direction when the probe card is cleaned using the cleaning wafer;
   a seal mechanism configured to allow a sealed space to be provided between the probe card holder and the chuck top;
   a pressure sensor configured to detect an internal pressure of the sealed space, which fluctuates with an operation of the chuck top driven by the aligner; and
   an electro-pneumatic regulator configured to control the internal pressure of the sealed space by performing an intake or exhaust operation with respect to the sealed space based on the internal pressure detected by the pressure sensor.

2. The prober of claim 1, further comprising:
   a check valve configured to exhaust the sealed space when the internal pressure of the sealed space exceeds a preset pressure.

3. The prober of claim 2, wherein the electro-pneumatic regulator is configured to control the internal pressure of the sealed space based on a drive information of the aligner.

4. The prober of claim 1, wherein the electro-pneumatic regulator is configured to control the internal pressure of the sealed space based on a drive information of the aligner.

5. A method of cleaning a probe card, the method comprising:
   transferring a chuck top on which a cleaning wafer is placed to a position below a probe card having probes provided to be brought into contact with a wafer;
   forming, by a seal mechanism, a sealed space between a probe card holder configured to hold the probe card and the chuck top;
   operating an aligner configured to drive the chuck top in a vertical direction such that the cleaning wafer comes into contact with the probes; and
   controlling an internal pressure of the sealed space by performing, using an electro-pneumatic regulator, an intake or exhaust operation with respect to the sealed space, based on the internal pressure of the sealed space, wherein the internal pressure fluctuates with an operation of the chuck top driven by the aligner.

* * * * *